United States Patent [19]

Tsui

[11] 4,200,840
[45] Apr. 29, 1980

[54] DUAL DETECTION SCHEME FOR COMPRESSIVE RECEIVERS

[75] Inventor: James B. Y. Tsui, Centerville, Ohio

[73] Assignee: The United States of America as represented by the Secretary of the Air Force, Washington, D.C.

[21] Appl. No.: 949,284

[22] Filed: Oct. 6, 1978

[51] Int. Cl.² ............................................. H04B 17/00
[52] U.S. Cl. .................................. 455/226; 324/77 B; 343/5 SA
[58] Field of Search ................ 325/67, 332, 333, 335, 325/336, 337, 363; 324/77 B, 77 C, 77 CS; 343/5 SA, 17.7

[56] References Cited

U.S. PATENT DOCUMENTS

| 2,882,395 | 4/1959 | White | 325/332 |
| 3,879,661 | 4/1975 | Collins | 324/77 B |
| 3,955,137 | 5/1976 | Harrington et al. | 324/77 B |
| 4,005,417 | 1/1977 | Collins | 343/5 SA |
| 4,131,852 | 12/1978 | Holland-Moritz | 343/5 SA |

Primary Examiner—John C. Martin
Assistant Examiner—Jin F. Ng
Attorney, Agent, or Firm—Joseph E. Rusz; Casimer K. Salys

[57] ABSTRACT

Undesired spurious noise signals appearing in the dispersive delay line (DDL) of a compressive receiver are suppressed and the dynamic range of the receiver is significantly increased by utilizing parallel channels of processing in combination with a signal comparator. Each channel contains a different weighting filter which accordingly modifies the signal passing therethrough. The weighting filters are selected to produce a reversal as to the signal having the largest relative amplitude at a time nearly coincident with the main lobe of the DDL created pulse. Thereby, the comparator produces a square wave form pulse which is nearly coincident in time with the main lobe of the DDL pulse, yet suppresses the adjacent spurious side lobes of the signal being processed in the receiver.

4 Claims, 7 Drawing Figures

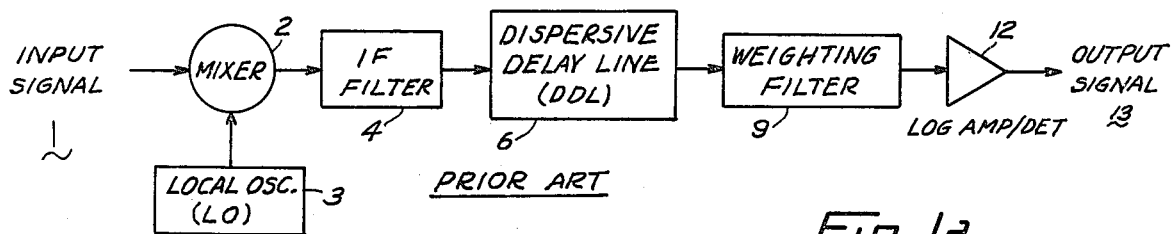
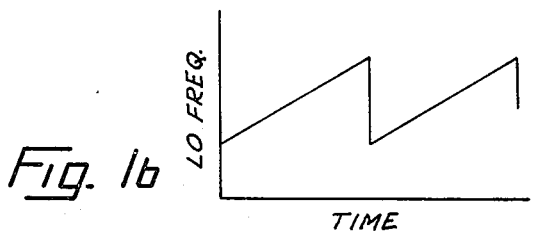
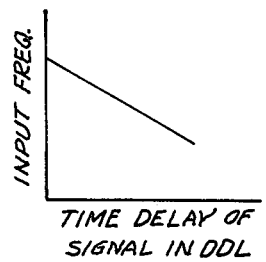
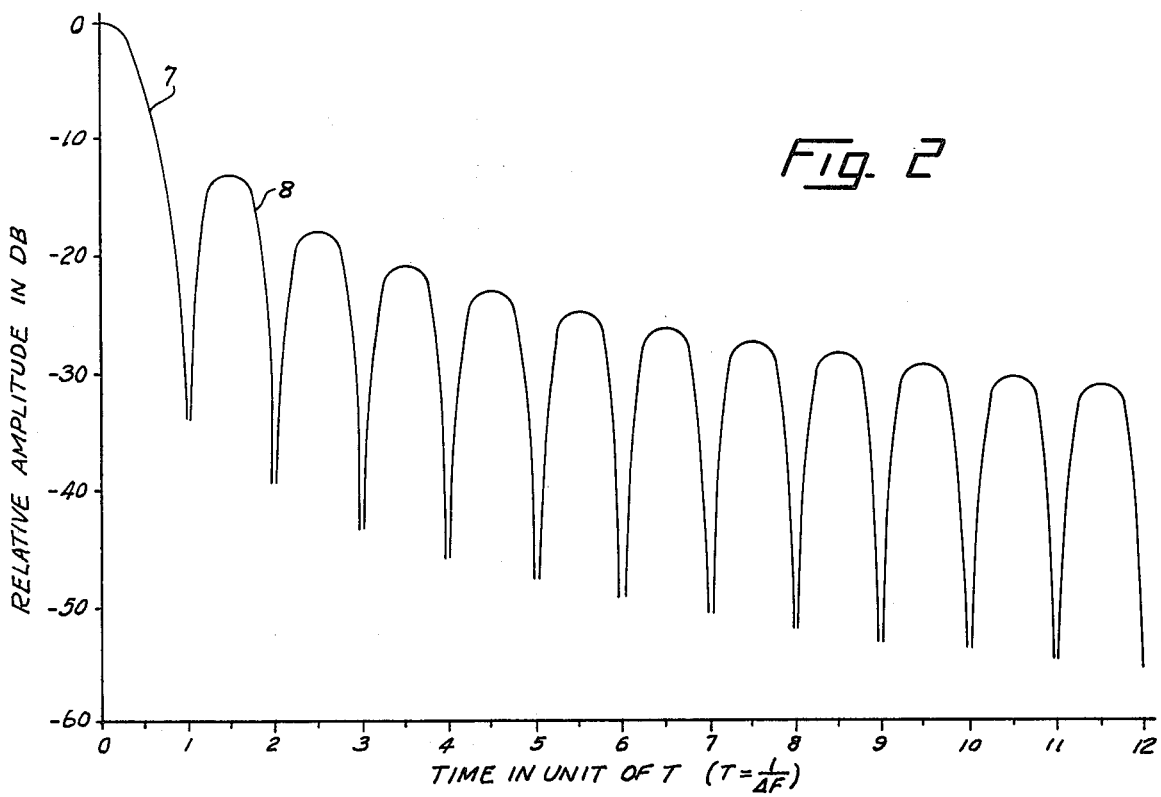
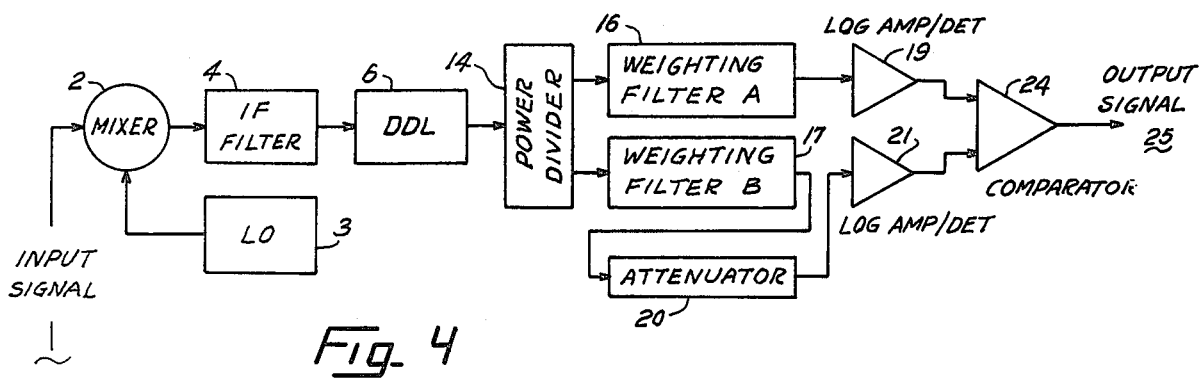

DUAL DETECTION SCHEME FOR COMPRESSIVE RECEIVERS

RIGHTS OF THE GOVERNMENT

The invention described herein may be manufactured and used by or for the Government of the United States for all governmental purposes without the payment of any royalty.

BACKGROUND OF THE INVENTION (1) Field of the Invention

This invention relates to high frequency radio receivers, particularly compressive receivers utilizing dispersive delay lines.

(2) Description of the Prior Art

Conventional compressive or microscan receivers operating at radar frequencies usually rely on a single channel to process the incoming signals. When the frequency characteristics of the incoming signal are being analyzed with the aid of a dispersive delay line (DDL), such as might be formed with a surface acoustic wave (SAW) device, the time domain output signal from the DDL contains spurious signals of significant levels. These spurious signals decrease the dynamic range of the receiver.

SUMMARY OF THE INVENTION

This invention is an electronic signal processor for use in a receiver having a DDL to reduce the effects of spurious signals on dynamic range without imposing significant sacrifices on the accuracy of the frequency measurement. When a fixed frequency signal is being received it is mixed in conventional fashion with a sweeping local oscillator to produce a sweep frequency signal having a prescribed intermediate frequency (IF) bandwidth. The swept IF signal is applied to a bandpass IF filter, the output of which is connected to a DDL. The DDL output signal is generally in the shape of a pulse having a main lobe and multiple leading and trailing side lobes. This pulse signal is power divided into two independent channels of processing, each having distinctly different weighting functions applied thereto. After appropriate amplification and detection the signals enter the two inputs of comparator which produces a square wave output pulse having a time duration closely corresponding to that of the main lobe.

The combined effect of selectively weighting the two signal channels and comparing their detected output magnitudes reduces the spurious side lobe effects, and thereby improves the receiver's dynamic range without significantly sacrificing the receiver's frequency measurement accuracy.

BRIEF DESCRIPTION OF THE DRAWINGS

FIG. 1 contains a schematic block diagram showing the functional elements in a conventional compressive type DDL receiver.

FIG. 1b graphically depicts the repetative frequency sweep of the local oscillator signal.

FIG. 1c contains a graph showing the relationship between signal frequency and time delay in the DDL.

FIG. 2 is a graph showing the waveform of the output signal from the DDL in FIG. 1.

FIG. 4 contains the block diagram of a two channel form of the DDL receiver.

DESCRIPTION OF THE PREFERRED EMBODIMENT

Figure 3:
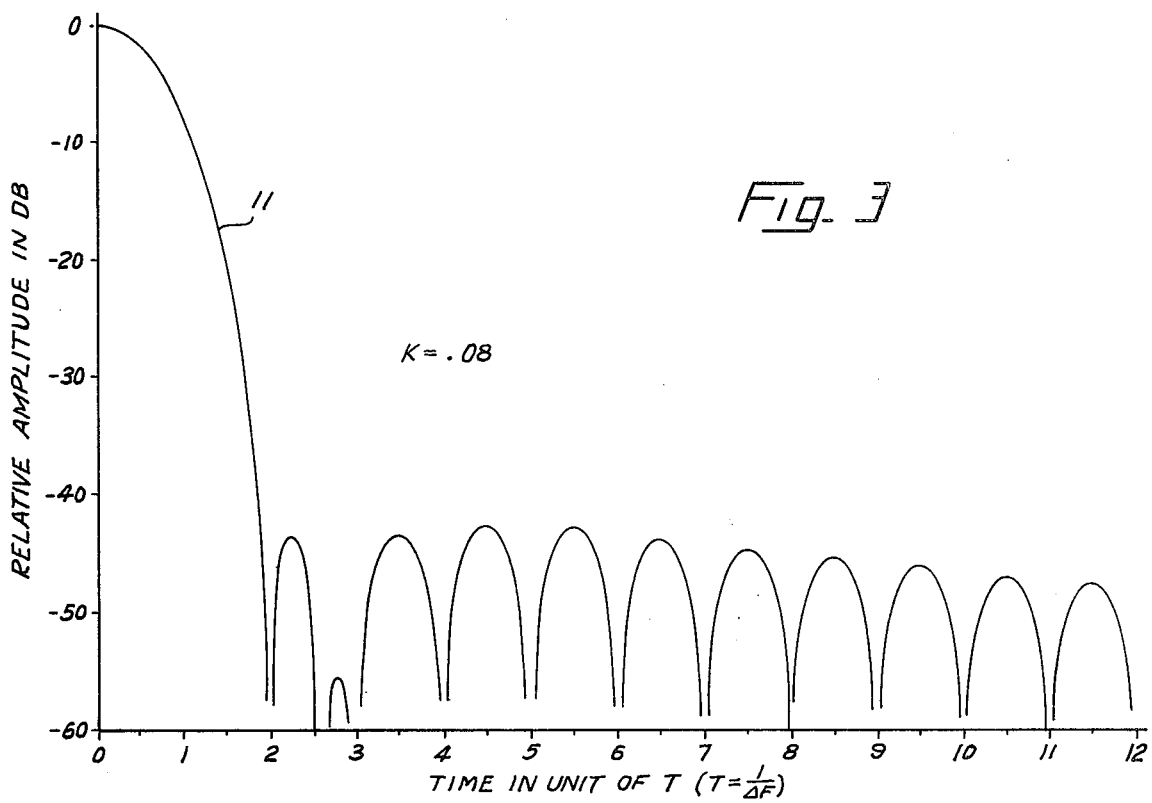
FIG. 3 shows the signal of FIG. 2 after it passes through a conventional weighting function.

The schematic of a conventional compressive or microscan type receiver having a DDL is shown by block diagram in FIG. 1a. Since the electronic elements necessary to perform the functions attributable to each block are well known by those skilled in the art, and the invention pertains to a unique combination of such functional blocks, no attempt is made to describe the individual devices comprising any single block.

To describe the operation of this prior art receiver, input signal 1 is defined to be a fixed but unknown frequency signal of the type normally received through a radar antenna. In the receiver of FIG. 1a this signal is combined in mixer 2 with the local oscillator (LO) signal generated in block 3. FIG. 1b displays the time response of the LO frequency, shown to have a sawtooth shape which is linearly varying with time. The output of mixer 2 is an intermediate frequency (IF) signal whose frequency distribution contains the sum and difference frequencies of input signal 1 and that generated by LO 3. Since the LO signal frequency is time varying, the sum and difference sidebands of the IF signal are similarly time dependent.

The next functional stage in this receiver, IF bandpass filter 4, completely attenuates one sideband and passes only a prescribed band of frequencies from the other sideband. Thereby, the output signal from IF filter 4 is a pulsed varying frequency IF signal whose pulse width or duration depends on the bandwidth of filter 4 and the rate at which the signal frequency from LO 3 varies.

The extended IF pulse is then introduced into DDL 6, preferably comprising a surface acoustic wave (SAW) device having a frequency related time delay of the form plotted in FIG. 1c. As shown in this figure, DDL 6 exhibits an inverse linear relationship between the signal frequency and the time required for a signal of that frequency to traverse the device. For this particular embodiment DDL 6 is selected to have a delay such that the beginning of the extended IF pulse from filter 4 is delayed a length of time equal to the pulse duration. Consequently, all the signal energy tends to emerge from DDL 6 as one instantaneous pulse.

The actual shape of the emerging pulse, in the time domain, is the Fourier transform of the bandpass shape exhibited by IF filter 4. This produces a DDL output pulse whose main lobe duration is approximately twice the reciprocal of the IF filter bandwidth. Since the characteristics of LO 3, IF filter 4 and DDL 6 are known, the timing of the emerging pulse provides frequency information about input signal 1.

The operation of weighting filter 9 will be described in the forthcoming paragraphs. The remaining stage, log amplifier/detector 12, operates in conventional fashion to limit and demodulate the signal from weighting filter 9 so that output signal 13 is maintained within the frequency and amplitude capabilities of the ensuing stages of processing.

The time domain output waveform from DDL 6 is plotted in FIG. 2. The vertical axis of the figure represents amplitude in dB while the horizontal axis is in units of time T. The unit T is by definition the reciprocal of the IF filter 4 bandwidth. Since the shape of the time domain pulse is symmetric about time=0, only the positive time segment of the waveshape is shown and described.

Accurate measurement of the zero time position is a prerequisite to obtaining an accurate frequency measurement of input signal 1. For the specific waveform plotted in FIG. 2, this entails distinguishing main lobe 7 from the leading (not plotted) and trailing side lobes. Since first side lobe 8 has a peak value only 13 dB below main lobe 7, the overall dynamic range of the receiver must be restricted to 13 dB if the side lobes are to be ignored by the electronics used to sense the main lobe. A dynamic range of 13 dB is an unacceptably poor performance for a receiver.

The conventional solution to this dynamic range limitation has been to introduce a weighting filter, such as weighting filter 9 in FIG. 1a. If the weighting filter is functionally linear for the range of signals processed, it may be located before DDL 6 with equal effectiveness. One commonly used weighting filter modifies the signal by imposing a weighting function generally known as a cosine on a pedestal. This weighting is frequency dependent and described mathematically as:

$$W(\omega) = K - (1-K) \cos^2(\pi\omega/\Delta\omega),$$

Where K is the weighting constant. The unweighted case is obtained by assigning a value 1 to the weighting constant. The variable $\omega$ is angular frequency and $\Delta\omega$ is defined as $2\pi$ times the bandwidth of IF filter 4.

For purposes of illustration, consider weighting filter 9 to contain such a weighting function with weighting constant K selected to be 0.08. This represents the well known Hamming weighting. The effect of incorporating this weighting filter is shown by the waveform plotted in FIG. 3. It is readily apparent that this weighting function reduces the side lobes to a magnitude approximately 43 dB below main lobe 11.

Nevertheless, further comparison of the waveforms plotted in FIGS. 2 and 3 discloses that the Hamming weighting produces at least one unwanted effect. This appears in FIG. 3, where main lobe 11 has been broadened to twice its previous width. Such an expansion of the main lobe duration decreases the measurement accuracy of pulse's position, which in turn decreases the frequency measurement accuracy of the overall receiver.

In addition, though it can be shown theoretically that a Hamming weighting function produces the effect plotted in FIG. 3 on the side lobes, severe filter design problems arise when actual electronic devices attempt to suppress the side lobes below 40 dB. Practical weighting filters suppress the side lobes in the range of 30–35 dB below the level of the main lobe and effectively limit the receiver's dynamic range to a comparable level.

This invention overcomes such dynamic range limitations by utilizing two parallel and independent signal paths followed by an amplitude comparator. Each signal path is treated by a different weighting function and each weighting function is selected to alter the signal passing through it differently. The combined objective of the two weighting functions is to produce a change in the comparator output which is nearly coincident in time with the main lobe from the DDL. Consequently, the objective is to create two signals which reverse their relative standings, as to the one having the larger amplitude, at times proximate to the onset and termination of the main lobe.

One embodiment of such an invention appears in FIG. 4. Mixer 2, LO 3, IF filter 4 and DDL 6 retain their relative locations and perform the same functions as described with reference to FIG. 1a. Immediately after DDL 6 the signal is partitioned by power divider 14 and introduced into the two parallel paths leading to weighting filters A and B, designated by respective reference numerals 16 and 17. The output of weighting filter 16 enters log amp/detector 19. The output of weighting filter 17 passes through fixed 3 dB attenuator 20 before entering log amp/detector 21. Attenuator 20 has been inserted to create a bias in the relative amplitudes of the two signals. It is an indispensable element of weighting applied to the signal reaching log amp/detector 20, shown separately in the embodiment of FIG. 4 to typify conventional fabrication and accentuate the similarities in weighting filters 16 and 17. Weighting filters 16 and 17 contain the cosine on a pedestal weighting function with weighting constants K selected to be 0.06 and 0.14, respectively. Log amp/detectors 19 and 21 perform the same function that they served with reference to FIG. 1a.

After limiting and demodulation, the two signals are applied to the two inputs of amplitude comparator 24. Output signal 25 from comparator 24 is in the form of a logic signal having a level of either 0 or 1. Comparator 24 operates such that its output is at logic level 1 when the input signal from the path having weighting filter 16 is larger than the signal from the path containing weighting filter 17. Otherwise, the comparator output remains at level 0.

Figure 5:
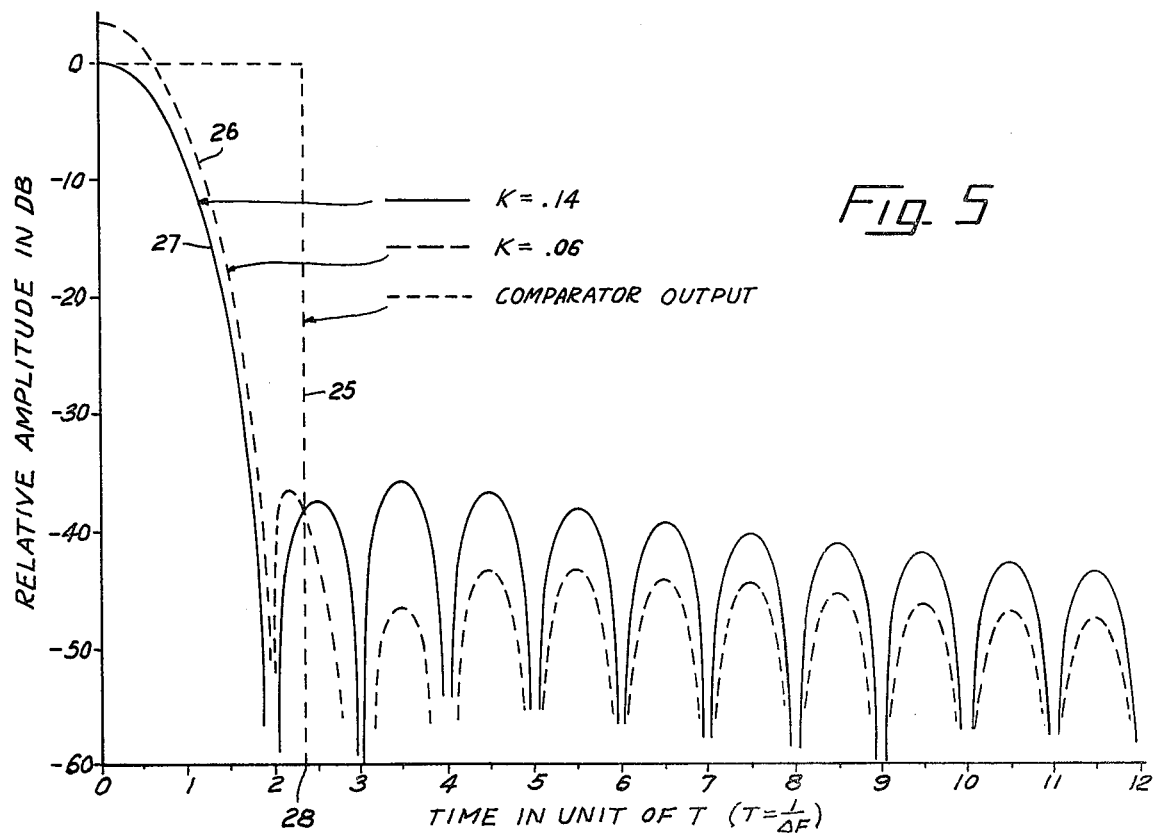
FIG. 5 is a graph showing signal waveforms at various locations in the schematic diagram of FIG. 4.

FIG. 5 contains waveforms from various locations in the schematic diagram of FIG. 4. Plot 25 depicts the output of comparator 24 when signals 26 and 27 represent the inputs to the comparator. When the time T reaches 2.4, designated by reference numeral 28, the inputs to comparator 24 reverse, as to the one having the larger relative amplitude, and cause the output from comparator 24 to change from logic level 1 to a level 0. Since the signal waveforms in FIG. 5 have a mirror image about the graph ordinate, output signal 25 is in the shape of a square wave equally distributed about time=0.

It is evident from FIG. 5 that output signal 25 is a square wave pulse having a duration slightly longer than either main lobe 26 or main lobe 27. Though the broader pulse width of output signal 25 slightly degrades the frequency resolution of the receiver, the loss is more than offset by the suppression of at least 10 side lobes either side of the main lobe. In addition, the amplitude of output signal 25 is now at least 48 dB greater than the nearest side lobe. And furthermore, the tolerance requirements on weighting filters 16 and 17 are relaxed because weighting filter accuracy is no longer critically linked to the dynamic range of the receiver.

The invention as shown and described herein contemplates other embodiments. For example, the invention can be used without LO 3 and mixer 2 if input signal 1 is already frequency modulated with a sweep of the form appearing in FIG. 1b, as occurs in FM radar systems. Merging any attenuation functions into the weighting filters is fully contemplated. If redundancy is not a material consideration, the function of DDL 6 in FIG. 5 can be replaced with an independent DDL in each of the two parallel paths. As a further variation, it is also contemplated that the transposed DDLs be combined with their respective weighting filters to form single functional units.

I claim:

1. A radio receiver comprising:
   a. means for converting a received radio frequency signal into an intermediate frequency signal the frequency of which varies linearly with time between lower and upper limits in a repeating cycle;
   b. a bandpass filter having its input coupled to said converting means and having a pass band situated between said lower and upper frequency limits for deriving from said intermediate frequency signals a series of like intermediate frequency pulses of a duration determined by the width of the pass band and the rate of the frequency variation of the intermediate frequency signal;
   c. means for compressing said intermediate frequency pulses to pulses of very short duration;
   d. means providing two separate signal channels each having means for weighting the signal in the channel as a function of frequency, weighting functions in two channels being different;
   e. means for applying said compressed pulses to said signal channels; and
   f. means for comparing the magnitudes of the weighted signals in the two channels and producing an output signal representing binary "1" when the magnitude of the weighted signal in the first of the two channels exceeds the magnitude of the weighted signal in the second of the two channels, and an output signal representing binary "0" when the magnitude of the weighted signal in the first of the two channels is less than that in the second channel.

2. The receiver of claim 1 in which the means for weighting the signal in the channel creates one channel with a greater signal attenuation than the other channel.

3. The receiver of claim 2 in which the means for compressing the intermediate frequency pulses comprises a dispersive delay line having its input coupled to the output of the bandpass filter and having a delay that has an inverse linear relationship to frequency with maximum delay equal to the duration of the intermediate frequency pulses.

4. The receivers of claim 1, 2 or 3 in which the means for weighting the signal in each channel has a weighting function expressed by $$W(\omega) = K - (1-K) \cos^2 (\pi\omega/\Delta\omega)$$

where K is a constant, $\omega = 2\pi f$, and $\Delta\omega$ is $2\pi$ times the bandwidth of the bandpass filter, and in which K is less than unity and has different values in the two channels.

* * * * *